US009735326B2

(12) United States Patent
Ikegami et al.

(10) Patent No.: US 9,735,326 B2
(45) Date of Patent: Aug. 15, 2017

(54) METHOD OF PRODUCING LIGHT EMITTING DEVICE

(71) Applicant: NICHIA CORPORATION, Anan-shi, Tokushima (JP)

(72) Inventors: Takeshi Ikegami, Anan (JP); Suguru Beppu, Anan (JP); Tatsuya Kanazawa, Anan (JP); Yoichi Bando, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/257,067

(22) Filed: Sep. 6, 2016

(65) Prior Publication Data
US 2016/0372644 A1 Dec. 22, 2016

Related U.S. Application Data

(63) Continuation of application No. 14/718,292, filed on May 21, 2015, now Pat. No. 9,461,219.

(30) Foreign Application Priority Data

May 21, 2014 (JP) ................................ 2014-105442
Mar. 27, 2015 (JP) ................................ 2015-066521

(51) Int. Cl.
*H01L 33/58* (2010.01)
*H01L 33/56* (2010.01)
(Continued)

(52) U.S. Cl.
CPC ............ *H01L 33/58* (2013.01); *H01L 27/156* (2013.01); *H01L 33/486* (2013.01); *H01L 33/50* (2013.01);
(Continued)

(58) Field of Classification Search
CPC ......... H01L 33/50; H01L 33/56; H01L 33/58; H01L 33/62
See application file for complete search history.

(56) References Cited

U.S. PATENT DOCUMENTS

2006/0055309 A1* 3/2006 Ono .................... H01L 25/0753
313/492
2013/0164868 A1 6/2013 Chen et al.
2015/0340578 A1* 11/2015 Tamaki .................. H01L 33/62
257/99

FOREIGN PATENT DOCUMENTS

JP          08-264842 A     10/1996
JP          2013-138132 A    7/2013
JP          2013-138209 A    7/2013

* cited by examiner

*Primary Examiner* — Armando Rodriguez
(74) *Attorney, Agent, or Firm* — Squire Patton Boggs (US) LLP

(57) ABSTRACT

A method of producing a light emitting device includes providing a light emitting element on a base member, the base member including an insulating member and a pair of connection terminals at least on an upper surface thereof. The connection terminals have an exposed portion exposed to outside, with the light emitting element electrically connected to the connection terminals. A covering member is disposed to cover at least a portion of the upper surface of the light emitting element, and a protective layer is disposed to cover at least a portion of the exposed portions of the connection terminals. The covering member is removed, and material from the upper surface side of the base member is supplied to dispose a light-transmissive member on the upper surface of the light emitting element. At least a portion of the light-transmissive member present on the protective layer is then removed.

14 Claims, 6 Drawing Sheets

(51) Int. Cl.
*H01L 33/62* (2010.01)
*H01L 33/48* (2010.01)
*H01L 33/50* (2010.01)
*H01L 27/15* (2006.01)

(52) U.S. Cl.
CPC .............. *H01L 33/56* (2013.01); *H01L 33/62* (2013.01); *H01L 2224/16225* (2013.01); *H01L 2924/18161* (2013.01); *H01L 2933/0041* (2013.01); *H01L 2933/0058* (2013.01)

[Fig. 1A]
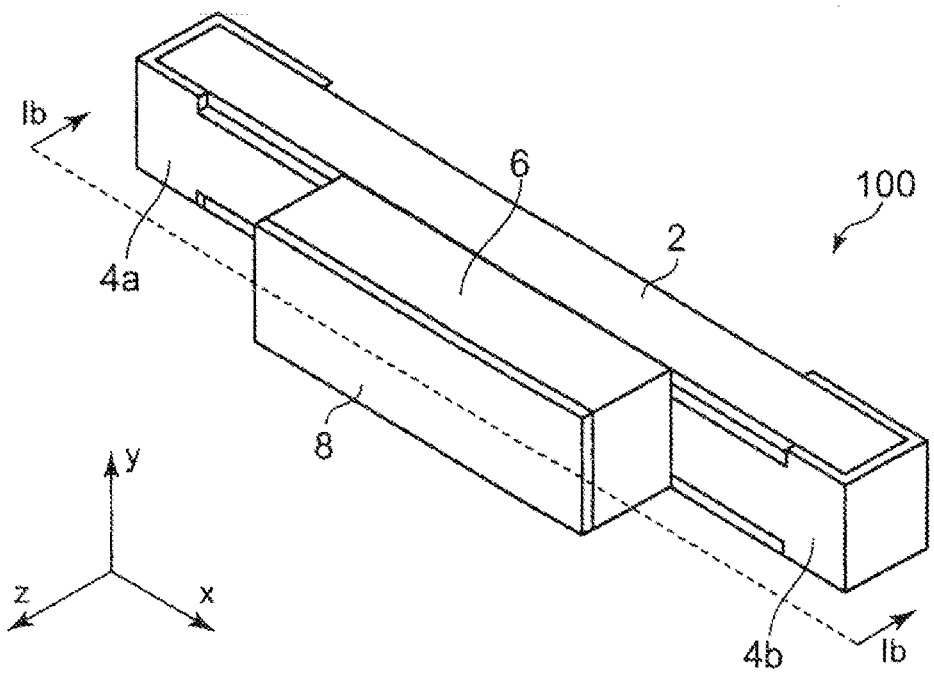
[Fig. 1B]
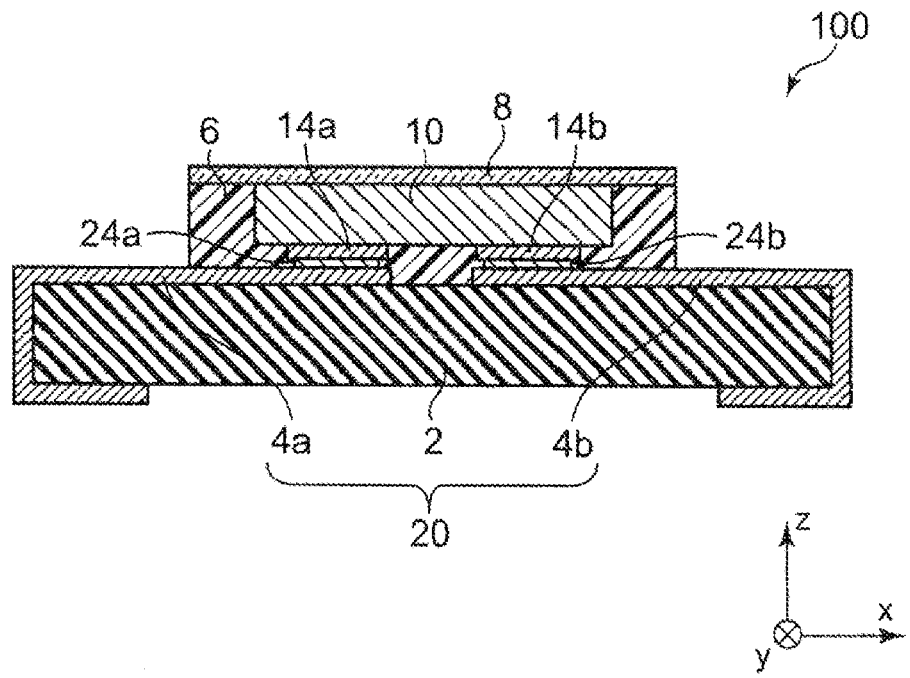

[Fig. 2A]
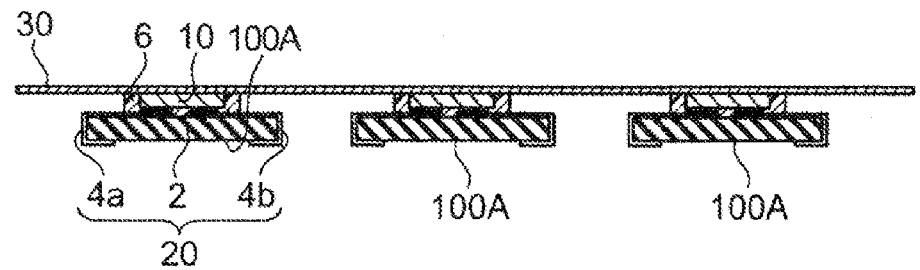
[Fig. 2B]
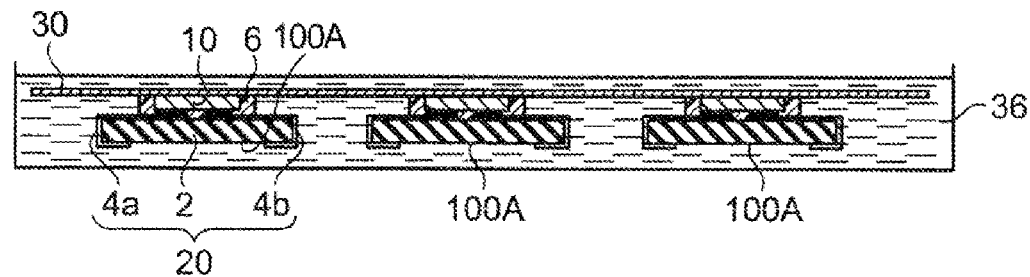
[Fig. 2C]
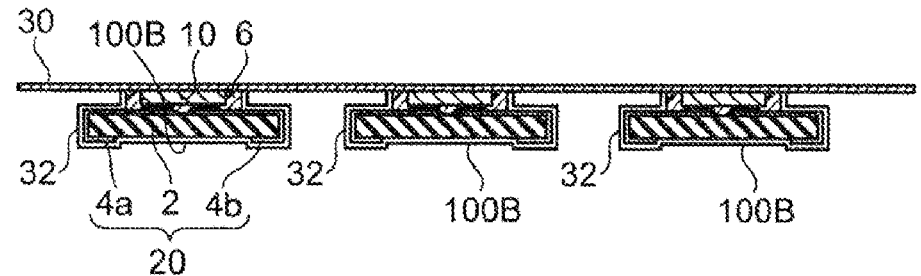

[Fig. 2D]
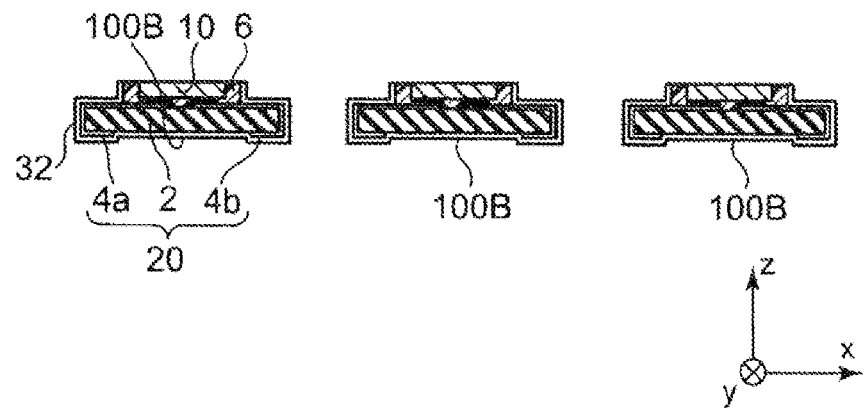
[Fig. 3A]
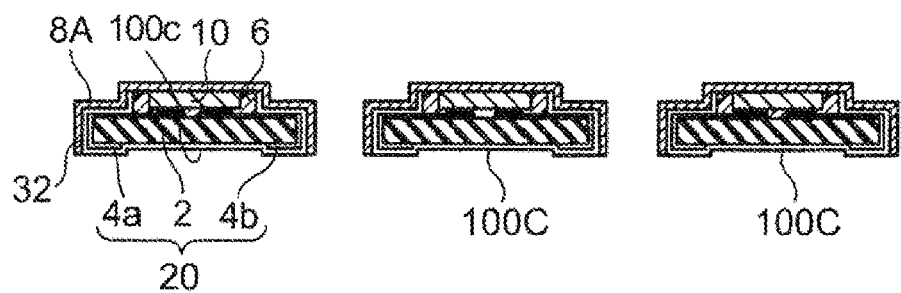
[Fig. 3B]
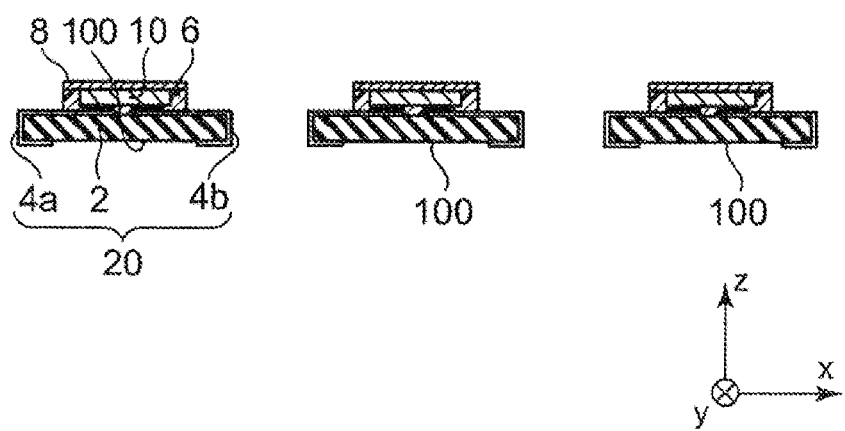

[Fig. 4]
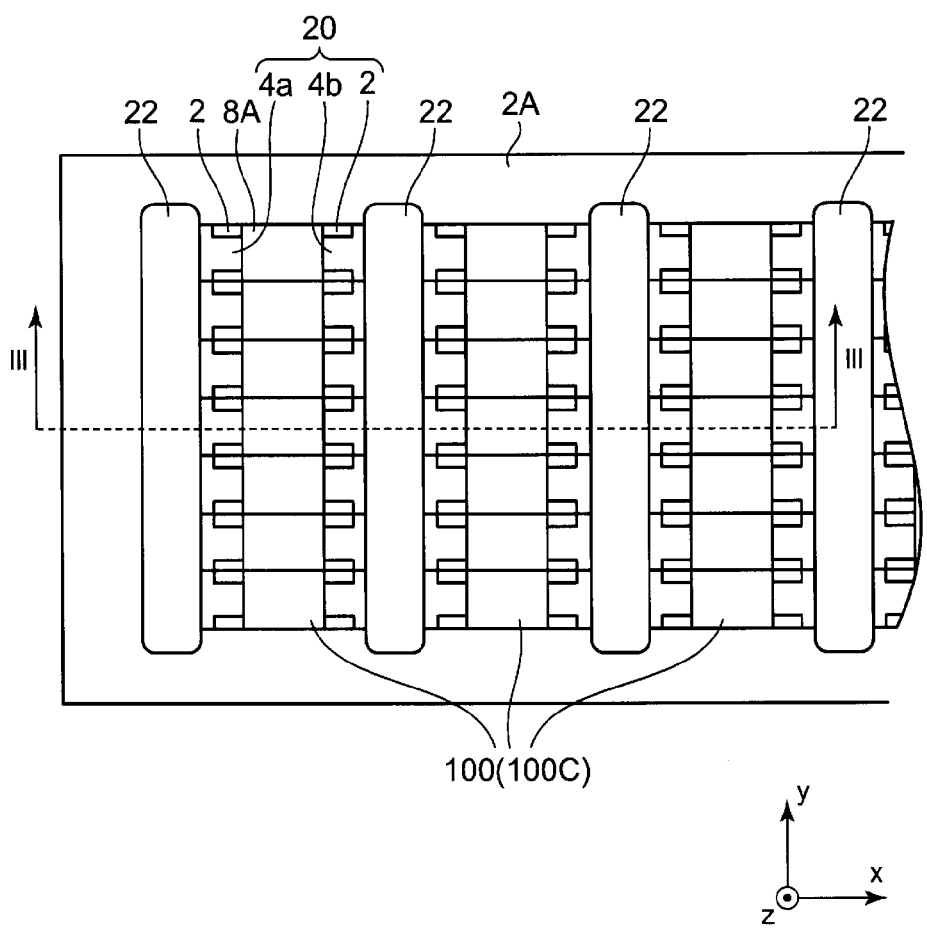

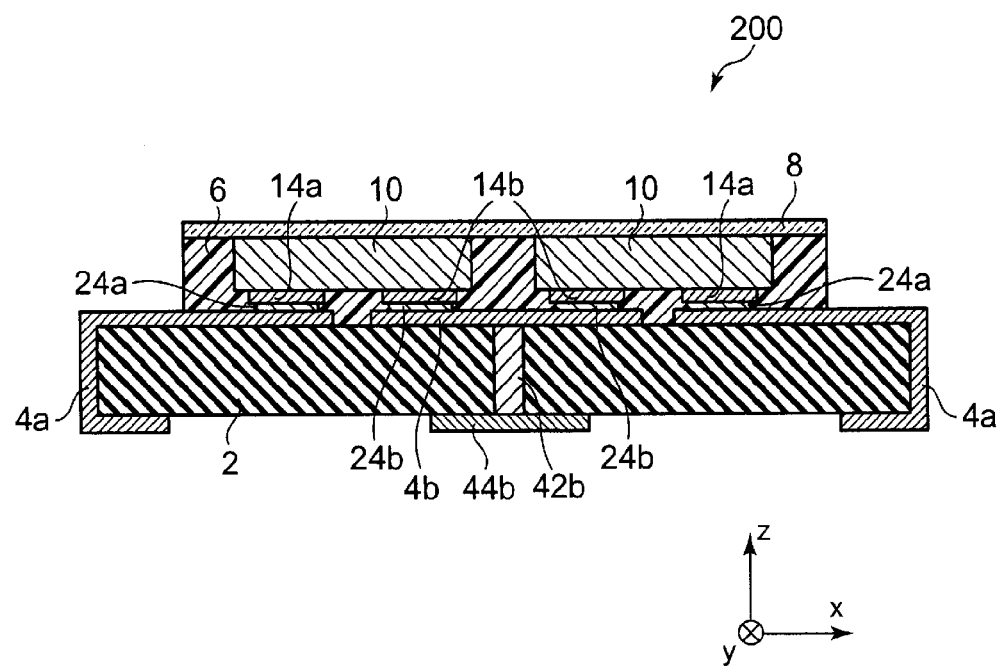
[Fig. 5]

[Fig. 6]
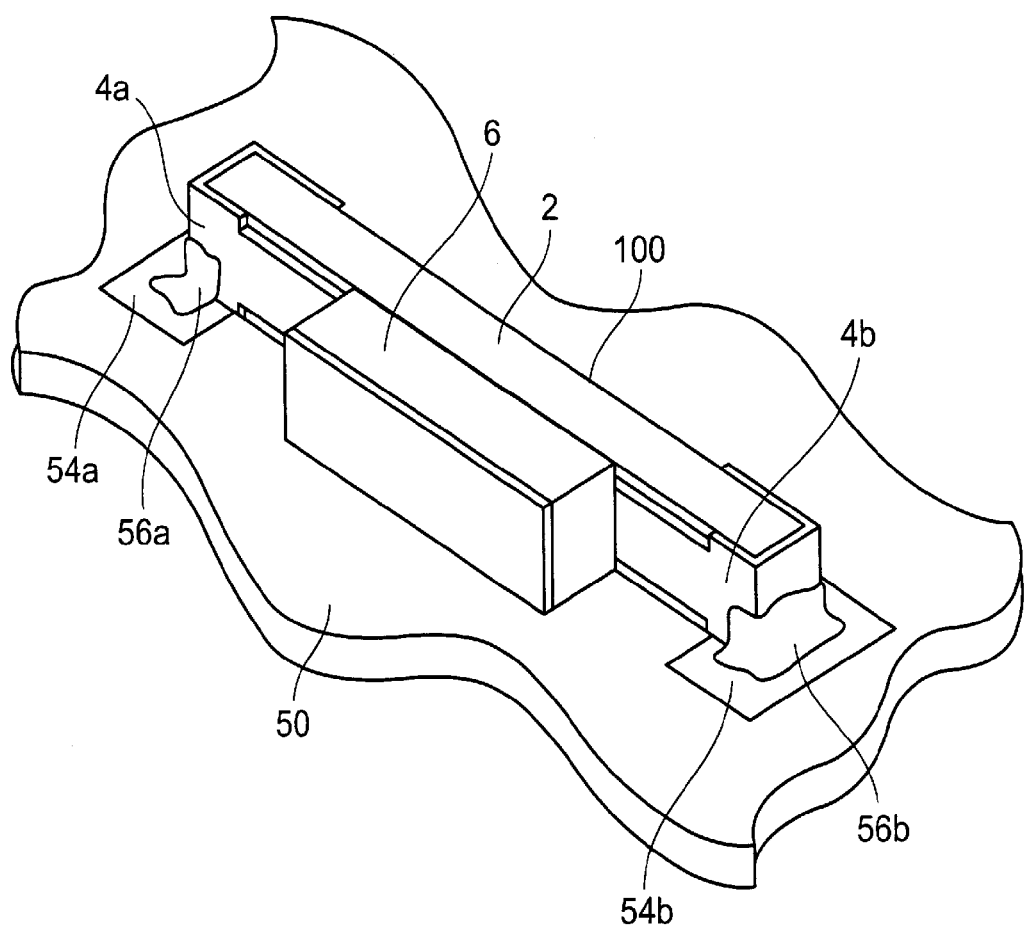

METHOD OF PRODUCING LIGHT EMITTING DEVICE

CROSS-REFERENCE TO RELATED APPLICATION

This application is a continuation of U.S. patent application Ser. No. 14/718,292 filed on May 21, 2015 which claims priority to Japanese Patent Application No. 2014-105442, filed on May 21, 2014, and No. 2015-066521, filed on May 27, 2015. The entire disclosure of these earlier applications are hereby incorporated herein by reference.

BACKGROUND

1. Technical Field

The present disclosure relates to a method of producing a light emitting device, particularly to a method of producing a light emitting device that includes a base member, a light emitting element, and a light-transmissive member. The base member is provided with an insulating member and a pair of connection terminals which are arranged at least on an upper surface of the insulating member and each has an exposed portion exposed to the outside. The light emitting element is arranged on an upper surface of the base member and is electrically connected to each of the pair of connection terminals. The light-transmissive member is disposed on an upper surface of the light emitting element.

2. Description of the Related Art

A light emitting device that employs a light emitting element such as an LED can easily achieve a high luminous efficiency, so that it is used in various applications that include a backlight of displays and lighting apparatus. In order to miniaturize a light emitting device that employs a light emitting element, there has been known a light emitting device in which a cavity is provided in a resin package and a light emitting element and a light-transmissive sealing resin (a light-transmissive member) which is used for sealing the light emitting element and which may contain a fluorescent material as needed, are placed in the cavity. JP H08-264842A discloses a side-view type light emitting device which is one example of such a light emitting device.

In recent years, demands for miniaturizing of various light emitting devices that include side-view type light emitting devices have been ever increasing. To meet those demands, other than those light emitting devices in which a light emitting element and a light-transmissive member are placed in a cavity of a resin package, a light emitting device with a configuration that can achieve further miniaturizing has been required. The growing demands are also on the production of such light emitting devices inexpensively and in large quantity.

SUMMARY

Accordingly, an object of embodiments of the present invention is to provide a method of efficiently producing a light emitting device with a configuration that achieves miniaturizing of the light emitting device.

According to embodiments of the present invention, a method produces a light emitting device that includes a base member which includes an insulating member and a pair of connection terminals which are arranged at least on an upper surface of the insulating member and each of which has an exposed portion exposed to the outside. A light emitting element is arranged on an upper surface of the base member and is electrically connected to each of the connection terminals. A light-transmissive member is disposed on an upper surface of the light emitting element. The method includes providing a light emitting element arranged on the upper surface of the base member, and disposing a covering member which covers at least a portion of the upper surface of the light emitting element. After the disposing a covering member, a protective layer is disposed to cover at least a portion of the exposed portions of the connection terminals. After removing the covering member, a material for a light-transmissive member is supplied from the upper surface side of the base member to dispose a light-transmissive member on the upper surface of the light emitting element. A portion of the light-transmissive member which is disposed on the protective layer is then removed.

With the use of such a method of producing, a light emitting device with a configuration that enables miniaturizing becomes possible to be produced easily.

BRIEF DESCRIPTION OF THE DRAWINGS

FIG. 1A is a schematic perspective view of a light emitting device 100 according to an embodiment of the present invention, and FIG. 1B is a schematic cross-sectional view showing a cross section at Ib-Ib in FIG. 1A.

FIGS. 2A to 2D and FIGS. 3A, 3B are diagrams for illustrating a method of producing the light emitting device 100.

FIG. 4 is a schematic top view showing a plurality of light emitting devices 100 in a state before being singulated, more precisely, showing a plurality of light emitting devices 100C in a production process in a state with a light transmissive member 8A disposed also on the portions other than the intended portions.

FIG. 5 is a schematic cross-sectional view of a light emitting device 200 according to an embodiment employing a plurality of light emitting elements 10.

FIG. 6 is a schematic perspective view illustrating an embodiment in which a light emitting device 100 is mounted on a mounting substrate 50.

DETAILED DESCRIPTION

Various embodiments according to the present invention will be described below with reference to the drawings. Note that the embodiments shown below are intended as illustrative to give a concrete form to technical ideas of the present invention, and thus the technical scope of the invention shall not be limited to those described below. Configurations described in one embodiment can also be applied in other embodiments unless specifically indicated. In the description below, when appropriate, terms which indicate specific directions or locations (for example, "up", "down", "right", "left" and other terms expressing those) may be applied, but those terms are used for easy understanding of the disclosure with reference to the accompanying drawings, and thus the technical scope of the disclosure shall not be limited by the meaning of those terms. Note that the sizes and the arrangement relationships of the members in each of drawings are occasionally shown exaggerated for ease of explanation. The same numerals in different drawings indicate the same or similar portions or members.

Before describing a method of producing a light emitting device according to an embodiment of the present invention, a light emitting device according to an embodiment of the present invention will be described below. FIG. 1A is a schematic perspective view of a light emitting device 100 according to an embodiment of the present invention, and FIG. 1B is a schematic cross-sectional view showing a cross section taken along line Ib-Ib in FIG. 1A. The light emitting device 100 includes a base member 20 which has an insulating member 2 and a pair of connection terminals 4a, 4b, a light emitting element 10, and a light-transmissive member 8.

The pair of connection terminals 4a, 4b are disposed on at least one surface (for example, an upper surface) of the insulating member 2.

The pair of connection terminals 4a, 4b can be disposed on two surfaces (for example, an upper surface and a lower surface) of the insulating member 2, as shown in FIGS. 1A and 1B, disposed on three surfaces (for example, an upper surface, a lower surface and a side surface which connects the upper surface and the lower surface). In each of the attached diagrams, the Z direction indicates the upward direction. Accordingly, the term "upper surface" refers to a surface, in each figure, which is in parallel to the X-Y plane and located in the Z-direction side. The light emitting device 100 can be used at any angle, so that for example, in the diagrams shown in FIG. 1A and FIG. 6 which depicts an embodiment to be described in detail later in the specification, the upper surfaces (surfaces located in the Z-direction side among the surfaces in parallel to the X-Y plane) are not shown in an upper side in the drawings. As described above, note that depending on the arrangement of the light emitting device 100, an upper surface does not always locate in an upper part in a drawing.

The connection terminals 4a, 4b respectively have an exposed portion where at least a portion of each connection terminal is exposed to the outside. The exposed portions are formed on one or more surfaces of the insulating member 2. Preferably, the exposed portions are formed on two or more surfaces of the insulating member 2. This achieves more reliable electrical connection with the wiring layers on the mounting substrate at the time of mounting the light emitting device 100 on the mounting substrate, the detailed description to be presented later in the specification. In the embodiment shown in FIGS. 1A and 1B, the connection terminal 4a has an exposed portion located on an upper surface, a lower surface and one of two side surfaces (surfaces parallel to the Y-Z plane) connecting the upper surface and the lower surface of the insulating member 2 at the left side of the light emitting device 100, and the connection terminal 4b has an exposed portion located on an upper surface, a lower surface and one of two side surfaces connecting the right side of the light emitting device 100. The connection terminal 4a is electrically connected to the electrode (first electrode) 14a of the light emitting element 10 and the connection terminal 4b is electrically connected to the electrode (second electrode) 14b of the light emitting element 10. The electrode 14a is either one of the positive electrode (p-side electrode) or the negative electrode (n-side electrode) and the electrode 14b is the other of the positive electrode or the negative electrode.

The light emitting element 10 is arranged on one surface of the base member 20, for example, on an upper surface (that is, an upper surface of the insulating member 2). As shown in FIG. 1B, the light emitting element 10 may be mounted on the base member 20 by way of flip-chip mounting. That is, the connection terminal 4a of the base member 20 and the electrode 14a of the light emitting element 10 are arranged opposite to each other and connected, for example, via a bonding member 24a. Further, the connection terminal 4b of the base member 20 and the electrode 14b of the light emitting element 10 are arranged opposite to each other and connected, for example, via a bonding member 24b. Examples of the bonding members 24a, 24b include a solder such as tin-bismuth-based solder, tin-copper-based solder, tin-silver-based solder, gold-tin-based solder, a eutectic alloy (an alloy whose main component is gold and tin, an alloy whose main component is gold and silicon, an alloy whose main component is gold and germanium, etc.), an electrically conductive paste of silver, gold, palladium, or the like, a bump, an anisotropic conductive material, and a brazing material made of a low-melting-point metal, etc. In the embodiment shown in FIG. 1B, the electrodes 14a, 14b are disposed to protrude on the lower surface of the light emitting element 10; however, alternatively or additionally to this configuration, protruded portions that have an approximately same planar dimension (a planar dimension viewed in the −Z-direction) as that of the electrode 14a and the electrode 14b and that are protruded upward (in the Z-direction) may be arranged on the connection terminal 4a and the connection terminal 4b, respectively. With such protruded portions, a self-alignment effect can be achieved and the accuracy of positioning of the light emitting element 10 can be improved. The method of mounting a light emitting element 10 on the upper surface of the base member 20 is not limited to that described above; any appropriate method can be employed.

The light emitting element 10 can be any appropriate known light emitting element; an LED chip may be employed. The light emitting element 10 may be provided with a semiconductor stacked layer body and can be provided with a nitride-based semiconductor stacked layer body. The semiconductor stacked layer body (preferably a nitride-based semiconductor stacked layer body) may have a first semiconductor layer (for example, an n-type semiconductor layer), a light emitting layer, and a second semiconductor layer (for example, a p-type semiconductor layer), in this order. Also, both the electrode 14a electrically connected to the first semiconductor layer and the electrode 14b electrically connected to the second semiconductor layer can be disposed on the same surface side (for example, a surface of the second semiconductor layer side) of the semiconductor stacked layer body.

The type and materials of the first semiconductor layer, the light emitting layer, and the second semiconductor layer are not specifically limited and can be appropriately selected from, for example, Group III-V compound semiconductors, Group II-VI compound semiconductors, and various other semiconductors. More specifically, $In_XAl_YGa_{1-X-Y}N$ ($0 \leq X$, $0 \leq Y$, $X+Y \leq 1$) may be used as a nitride semiconductor material. Each of the layers can be formed with a thickness and a structure that are known in the art.

Of the four side surfaces (the two surfaces parallel to the X-Z plane and the two surfaces parallel to the Y-Z plane) of the light emitting element 10, the whole or a portion of at least one side surface can be covered with a light-shielding member 6. In one embodiment, as shown in FIGS. 1A and 1B, the whole of all the four side surfaces are covered with the light-shielding member 6. Further, the lower surface (a surface in the −Z-direction side of the two surfaces parallel to the X-Y plane) of the light emitting element 10 can be covered with the light-shielding member 6 except for the portions for the electrodes 14a and 14b. The configuration with the light-shielding member 6 according to this embodiment can have an effect of preventing light of the light emitting element 10 from being extracted in unintended directions.

The material that constitutes the light-shielding member 6 is not specifically limited and can be selected from any appropriate materials that include ceramic, resins, dielectric materials, pulp, glass, or complex materials of those can be employed. Of those, a resin is used in certain embodiments in view of easiness in molding into a desired shape. The light-shielding member 6 can have a reflectance to the light from the light emitting element 10 of 60% or more, in some embodiments 70% or more, and in other embodiments 80% or more or even 90% or more. In order to obtain appropriate light shielding property in the light-shielding member 6, a light-reflecting member, a light-scattering material, or a coloring agent such as titanium oxide, silicon dioxide, zirconium dioxide, potassium titanate, alumina, aluminum nitride, boron nitride, mullite, niobium oxide, xinc oxide, barium sulfate, carbon black, various rear-earth oxides (for example, yttrium oxide, gadolinium oxide) may be contained in those materials such as a resin described above.

A light-transmissive member 8 to allow the light emitted from the light emitting element 10 to pass therethrough is disposed on the upper surface (that is, the light extracting surface of the light emitting element 10) of the light emitting element 10. The light-transmissive member 8 can cover the whole of the upper surface of the light emitting element 10. In the case of having the light-shielding member 6 on a side surface of the light emitting element 10, as shown in FIGS. 1A and 1B, at least a portion of the upper surface of the light-shielding member 6 (that is, the upper surface of the portion of the light-shielding member 6 that covers the side surface of the light emitting element 10), and in some cases the whole upper surface of the portion of the light-shielding member 6 that covers the side surface of the light emitting element 10, can be covered with the light-transmissive member 8. This is because, light propagating upward (in the Z-direction) from the vicinity of the interface between the light emitting element 10 and the light-shielding member 6 can be surely guided into the light-transmissive member. The light-transmissive member 8 allows passing of light emitted from the light emitting element 10 and entered in the light-transmissive member 8, at a rate of 60% or more, 70% or more, 80% or more, or even 90% or more. Examples of a suitable material for such a light-transmissive member 8 include a resin material. Examples of suitable resin materials include a silicone resin, a modified silicone resin, an epoxy resin, a modified epoxy resin, a phenol resin, a polycarbonate resin, an acrylic resin, a TPX resin, a polynorbornene resin, or a hybrid resin which contains one or more of those resins. Of those, a silicone resin or an epoxy resin is used in some embodiments. A silicone resin that has excellent light resistant property and heat resistant property can be used. The light-transmissive member 8 may be a glass obtained by using a sol-gel method.

The light-transmissive member 8 can contain a fluorescent material which can be excited by the light from the light emitting element 10 and can emit light with a wavelength that is different from that of the light that is emitted from the light emitting element 10. For the fluorescent material, a known material in the art can be used. Specific examples of the fluorescent material include a yttrium aluminum garnet (YAG)-based fluorescent material activated with cerium, a lutetium aluminum garnet (LAG)-based fluorescent material activated with cerium, a nitrogen-containing calcium aluminosilicate ($CaO—Al_2O_3—SiO_2$) activated with europium and/or chromium, a silicate (($Sr,Ba)_2SiO_4$)-based fluorescent material activated with europium, a β-sialon-based fluorescent material, nitride-based fluorescent materials such as a CASN-based fluorescent a material and a SCASN-based fluorescent material, KSF-based fluorescent material ($K_2SiF_6$:Mn), and a sulfide-based fluorescent material. With the light-transmissive member 8 containing a fluorescent material, the light emitting device 100 can be made as a light emitting device to emit light of mixed color having a visible wavelength (for example, a while light) of primary light and secondary light, or as a light emitting device to emit secondary light having a visible wavelength upon being excited by primary light in the ultraviolet region can be obtained. In the case where the light emitting device 100 is used for the backlight of liquid crystal display or the like, a fluorescent material which is excited by a blue light and emits a red light (for example, a KSF-based fluorescent material) and a fluorescent material which is excited by a blue light and emits a green light (for example, a β-sialon-based fluorescent material) can be used. With this arrangement, the color reproduction range of the display which used the light emitting device can be expanded. In the case where the light emitting device is used for lighting, a light emitting element to emit blue-green light and a red fluorescent material can be used in combination.

The median particle diameter of the fluorescent material can be, for example, 50 μm or less, 30 μm or less, or 10 μm or less. The median particle diameter can be measured and calculated by using a commercially available particle measuring instrument or particle distribution measuring instrument. The particle diameter described above is indicated as a F.S.S.S.No. (Fisher Sub Sieve Sizer's Number) that is determined by using an air permeable method.

The fluorescent material may be a light emitting material which is called a quantum dot (or nano-crystal) fluorescent material. Examples of the quantum dot materials include, a semiconductor material such as a group II-VI semiconductor, a group III-V semiconductor, and a group IV-VI semiconductor, more specifically, high dispersion particles of nano size made of, CdSe, core-shell type $CdS_xSe_{1-x}$/ZnS, and GaP. Such fluorescent materials may have a particle diameter (average particle diameter) of about 1 to 20 nm (corresponding to 10 to 50 atoms). With the use of such a fluorescent material, internal scattering can be reduced and the transmittance of light can be further improved. Reducing the internal scattering allows for an increase of a light distribution component in a direction perpendicular to the upper surface while suppressing light that propagating toward the side surfaces or the lower surface of the light emitting device 100. With this arrangement described above, the light extraction efficiency can be further improved. This means that in the case of using the light emitting device 100 as a backlight of a display, light incidence efficiency to the display can be further improved. The quantum dot fluorescent material can be provided with a surface modification or stabilized with the use of a resin such as a PMMA (poly methyl methacrylate).

The light-transmissive member 8 may be a stacked-layer member made of a plurality of layers each containing particles of a fluorescent material. With this arrangement, scattering of light in the light-transmissive member can be further reduced and the light extraction efficiency can be further improved.

The light-transmissive member 8 may contain a filler (for example, a diffusion agent, a coloring agent, or the like). Specific examples of the filler include silica, titanium oxide, zirconium oxide, magnesium oxide, a glass, a crystal or sintered body of a fluorescent material, a sintered body of a fluorescent material and an inorganic bonding material. The filler may have an appropriate refractive index of 1.8 or more, for example.

In the case of using particles of a filler, particles of any appropriate shape such as a crushed shape, a spherical shape, a hollow shape or a porous shape can be used. The average particle diameter (median diameter) of the particles can be about 0.08 to 10 μm with which light scattering effect can be obtained with a high efficiency. The amount of the fluorescent material and/or the filler can be, for example, about 10 to 80 weight % with respect to the total weight of the light-transmissive member 8.

The light emitting device 100 that has a configuration as described above is, for example, mounted on a mounting substrate or the like. The wiring layers or the like of the mounting substrate and the connection terminals 4a, 4b of the light emitting device 100 are electrically connected. Thus, upon being connected to a power source, the light emitting device emits light.

The insulating member 2 has insulating property sufficient to prevent occurrence of short circuit between the connection terminal 4a and the connection terminal 4b which may result in insufficient supply of electric current to the light emitting element 10. In order to obtain such insulating property, the insulating member 2 may contain a ceramic, a resin, a dielectric material, pulp, glass, paper, or a composite material of those (for example, a composite resin), or a composite material of those materials and an electrically conductive material (for example, a metal, carbon, etc.). The insulating member 2 can contain a resin. The resin may be any resin used in the art. Specific examples of the resin include an epoxy resin, a bismaleimide triazine (BT) resin, a polyimide resin, a cyanate resin, a polyvinyl acetal resin, a phenoxy resin, an acrylic resin, an alkyd resin, and a urethane resin. In some embodiments, a bismaleimide triazine (BT) resin that has high heat resistant property, low dielectric property, etc., can be used.

FIG. 6 is a schematic perspective view illustrating an embodiment in which a light emitting device 100 is mounted on a mounting substrate 50. The light emitting device 100 is mounted on the mounting substrate 50 with one of its side surfaces or one of the side surfaces of the insulating member 2, that is a surface parallel to the X-Z plane, facing a surface (a main surface) of the mounting substrate 50. That is, the surface of the mounting substrate 50 is provided with wiring layers 54a, 54b that are electrically connected to an external power source which is not shown in FIG. 6. In the light emitting device 100, the side surface serves as the mounting surface and the upper surface of the light emitting device 100 (that is the upper surface of the light emitting element 10) serves as the light extracting surface. That is, in an embodiment shown in FIG. 6, the light emitting device 100 is a so-called side-view type light emitting device in that a surface adjacent to the light extracting surface serves as the mounting surface. The light emitting devices according to the present disclosure are not limited to that described above and include a so-called top-view type light emitting device in which the mounting surface is a surface that is the opposite side from the light extracting surface.

The light emitting device 100 is arranged so that at least a portion of the exposed portion of the connection terminal 4a is located on the wiring layer 54a and at least a portion of the exposed portion of the connection terminal 4b is located on the wiring layer 54b. The wiring layer 54a and the exposed portion of the connection terminal 4a are connected via an external bonding member 56a such as a solder. Thus, the connection terminal 4a and an external power source are electrically connected to each other. The wiring layer 54b and the exposed portion of the connection terminal 4b are connected via an external bonding member 56b such as a solder. Thus, the connection terminal 4b and an external power source are electrically connected to each other. With this arrangement, electric power can be supplied from an external power source to the light emitting device 100 to obtain a desired emission from the light emitting device 100.

In the case where the connection terminal 4a is disposed on a plurality of surfaces of the insulating member 2 (for example two or more surfaces of the upper surface, the lower surface and the side surfaces of the insulating member 2), the external bonding member 56a can be arranged over the plurality of surfaces to cover at least a portion of the exposed portions. Because with the arrangement described above, the contact area between the external bonding member 56a and the connection terminal 4a and the contact area between the external bonding member 56a and the wiring layer 54a can be increased and a fillet can be formed, so that heat dissipation performance and mounting stability of the light emitting device 100 can be improved. In a similar manner as described above, in the case where the connection terminal 4b is disposed on a plurality of surfaces of the insulating member 2 (for example two or more surfaces of the upper surface, the lower surface and the side surfaces of the insulating member 2), the external bonding member 56b can be arranged over the plurality of surfaces to cover at least a portion of the exposed portions. In an embodiment shown in FIG. 6, the external bonding member 56a is in contact with the exposed portions of the connection terminal 4a on the upper surface, the lower surface, and one side surface (one of the two surfaces parallel to the Y-Z plane) of the insulating member 2, and the external bonding member 56b is in contact with the exposed portions of the connection terminal 4b on the upper surface, the lower surface, and the other side surface (the other of the two surfaces parallel to the Y-Z plane) of the insulating member 2.

Miniaturizing of the light emitting device 100 that has the configuration as described above is easier than conventional light emitting devices; in such conventional light emitting devices, at least one light emitting element and a light-transmissive sealing resin (which is a light-transmissive member) which seals the light emitting element and may contain a fluorescent material as needed are disposed in a cavity defined in a resin package. In the conventional light emitting devices, a predetermined clearance was required between the side surfaces defining the cavity of the resin package and the light emitting element. However, in the light emitting device 100, even in the case where a light-shielding member 6 is to be provided, the light-shielding member can be disposed in contact with the light emitting element 10, which facilitates miniaturizing of the light emitting device. Further, in the conventional light emitting devices, the light-transmissive member is typically provided by hardening a resin in the cavity, which requires a certain thickness of the light-transmissive member. In the light emitting device 100, on the other hand, a sheet-shaped light-transmissive member 8 can be employed which allows a decrease in the thickness of the light emitting device 100. This also can contribute miniaturizing of the light emitting device.

Next, a method of producing a light emitting device 100 will be described. An embodiment described below relates to a method of efficiently producing a light emitting device 100. In a method of producing the light emitting device 100, an operation that requires efficiency is forming the light-transmissive member 8. As described above, in the conventional devices, the light-transmissive member takes a form of, for example, a sealing resin in the cavity of the resin package. Such a light-transmissive member can be formed easily in such a manner that after disposing a light emitting element in the cavity defined in a resin package, supplying (by potting for example) a melted resin that contains a fluorescent material as needed in the cavity and hardening the resin. This can be achieved because the melted resin can be captured by the inner walls defining the cavity.

However, in the light emitting device 100, such a resin package defining a cavity is not present, so that capturing by the inner walls defining the cavity is not taking place. That is, a method of forming a light-transmissive member on the upper surface of the light emitting element 10 without the periphery of itself being captured becomes a necessity. In order to achieve this, there has been a method for forming a light-transmissive member by spraying a material of the light-transmissive member by way of a spraying method. However, the upper surface of a light emitting element is a very small area, so that in many methods inclusive of such a spraying method, the light-transmissive member may be disposed also on unnecessary portions such as the entire upper surface and a side surface of the light emitting device. Further, the light-transmissive member is in many cases made of an insulating material, so that presence of the light-transmissive member on the exposed portions of the connection terminals may cause conduction failure when the light emitting device is mounted. Also, removal of the light-transmissive member that is formed in contact with a surface of the connecting member made of a metal or the like is not easy. Accordingly, a method that allows efficiently forming a light-transmissive member 8 only on a desired portion is desirable.

Except for disposing the light-transmissive member 8, the light emitting device 100 can be efficiently produced by using a known method. For example, providing a metal plating on the insulating member 2, the connection terminals 4a, 4b can be formed and the base member 20 can be obtained. Then, the light emitting element 10 is mounted in a flip-chip manner so that the light emitting element 10 is electrically connected to the connection terminals 4a, 4b of the upper surface of the base member 20. In the case of forming the light-shielding member 6, further, the base member 20 with the light emitting element 10 mounted on the upper surface thereof is placed in a cavity of a mold and transfer molding is performed, thus the light-shielding member 6 can be formed. As described above, in producing the light emitting device 100, portions other than the light-transmissive member 8 can be formed relatively easily and with high efficiency. But the light-transmissive member 8 cannot be formed with high efficiency by using a known method. Accordingly, a method of forming a light-transmissive member 8 will be described mainly below.

FIGS. 2A to 2D and FIGS. 3A and 3B are diagrams for illustrating a method of producing the light emitting device 100. Of the reference numerals shown in the figures, the figures represented with a numeral "100" followed by an upper-case alphabetic character such as "100A", "100B", and "100C" indicate that the light emitting device 100 shown in each figure is in a producing state (unfinished state).

The light emitting devices 100 can be individually produced. In order to obtain with high production efficiency, a plurality of light emitting devices 100 (particularly a plurality of insulating members 2) can be formed connected with each other (that is, a plurality of light emitting devices 100 are formed approximately simultaneously in a state of being connected with each other). The plurality of light emitting devices 100 are then singulated into individual light emitting devices 100 to obtain completed light emitting devices 100. FIG. 4 is a schematic top view showing a plurality of light emitting devices 100 in a state before being singulated, more precisely, showing a plurality of light emitting devices 100C in a production process in a state with a light transmissive member 8A disposed also on the portions other than the intended portions. The insulating plate 2A made of an insulating material and to provide a plurality of the insulating members 2 defines a plurality of penetrating slits 22, each penetrating the upper surface and the lower surface (penetrating in the Z-direction), at predetermined intervals. In FIG. 4, cutting lines between adjacent light emitting devices 100C at the time of singulating (straight lines extending in the X-direction from a slit 22 to other slit 22 between adjacent light emitting devices 100C) are shown for easy indication of individual light emitting devices 100C. It should be noted, however, that such cutting lines are virtual lines and cannot be visually recognized. The insulating member 2 of each of the light emitting devices 100 are parts of the insulating plate 2A until singulation is performed. In other words, the insulating member 2 of each of a plurality of light emitting devices 100 is in a state of being connected to each other. Further, in the state shown in FIG. 4, the light-transmissive member 8A is disposed also on the connection terminals 4a, 4b and the insulating members 2. But for the sake of easy understanding of the configuration of those members, portions of the light transmissive member 8A disposed on the connection terminals 4a, 4b and the insulating member 2 are not shown in the figure.

The connection terminals 4a and the connection terminals 4b can be formed by using a metal plating method, for example. Disposing a plated layer which is continuous from the upper surface of the insulating plate 2A, the side surfaces defining the slits 22 to the lower surface of the insulating plate 2A, the connection terminal 4a and the connection terminal 4b, shown in FIGS. 1A and 1B, that have exposed portions at the upper surface, the lower surface, and the side surfaces of the insulating member 2 can be formed.

Then, the light emitting element 10 is mounted in a flip-chip manner so as to be electrically connected to the connection terminals 4a, 4b. Further, in the case of forming the light-shielding member 6, the light-shielding member 6 can be formed by using a transfer molding method, for example. Then, the light-transmissive member 8A is disposed by using a method described below, thus, a plurality of light emitting devices 100C are completed in a state of being connected with each other. In FIG. 4, a total of 21 light emitting devices 100C, seven in the Y-direction and three in the X-direction (except for those partially shown in the figure) are shown. In order to achieve higher productivity, a larger number of the light emitting devices 100C, for example, several hundreds to several thousands of the light emitting devices 100C may be produced on the insulating plate 2A.

In FIGS. 2A to 2D and FIGS. 3A and 3B, three light emitting devices of one of 100, 100A, 100B, and 100C are shown. Those are three selected from a plurality of light emitting devices produced on the insulating plate 2A as described above, and those shown in FIGS. 2A to 2D and FIG. 3A are each cross sectional view corresponding to a cross section taken along line III-III of FIG. 4.

The light emitting devices 100A shown in FIG. 2A are in a production process of the light emitting devices 100 in a state where each of the light emitting devices 100A is already equipped with the components other than the light-transmissive member 8. That is, in each of the light emitting devices 100A, the light emitting element 10 is already disposed on the upper surface of the base member 20 that includes the connection terminals 4a, 4b and the insulating member 2. Then, the portions on the upper surfaces of the light emitting devices 100A, that include at least a portion of the upper surface of each of the light emitting elements 10, where the light-transmissive member 8 is to be disposed are covered with the covering member 30. In addition to at least a portion of the upper surface of each of the light emitting elements 10, at least a portion of the upper surface of the light-shielding member 6, for example, a portion of the upper surface of the light-shielding member that covers the side surfaces of the light emitting element 10, may be covered with the covering member 30. In the embodiment shown in FIG. 2A, the whole upper surfaces of the light emitting elements 10 and the whole upper surfaces of the light-shielding member 6 (i.e., the whole upper surfaces of the portions of the light-shielding member 6 that covers the side surfaces of each of the light emitting elements 10) are covered with the covering member 30.

The covering member 30 can be provided in a sheet form which includes a tape shape. As shown in FIG. 2A, the covering member 30 can be a sheet (it may be a tape shape) that covers the upper surfaces of the light emitting elements 10 of plurality of light emitting devices 100A. The covering member 30 can be made of any appropriate material, such as a sheet made of a rubber or a resin. Among resins, a polyimide resin can be used in certain embodiments. The covering member 30 in a sheet shape can be adhesive to the portion to cover such as the upper surface etc., of the light emitting element 10. For this reason, an adhesive layer can be disposed on a surface (one of the main surfaces) of the covering member 30 that faces the light emitting devices 100A. In the case of disposing the adhesive layer, in some embodiments, at the time of removing the covering member 30 (to be described later in the specification and as shown in FIG. 2D), a significant portion of the adhesive layer remains on the covering member 30 and substantially does not remain on the light emitting device 100B. In some embodiments, a high temperature operation at about 100 to 200° C. may be conducted, so that in removing the covering member 30 after rising temperature to about 100 to 200° C., a significant portion of the adhesive layer remains on the covering member 30 and substantially does not remain on the light emitting devices 100B.

Next, as shown in FIG. 2C, the exposed portions of the connection terminals 4a and 4b are at least partially covered with a protective layer 32. The light emitting device 100B shown in FIG. 2C is a light emitting device which has a protective layer 32 on its surface. Of the exposed portions of the connection terminals 4a, 4b, at least the portions to be in contact with the external bonding members 56a, 56b at the time of bonding the light emitting device 100 to the mounting substrate are covered with the protective layer 32. In order to efficiently dispose the protective layer 32, the protective layer 32 may cover any appropriate portions inclusive of the portions other than the exposed portions of the connection terminals 4a, 4b of the surface of the light emitting device 100A which are not covered with the covering member 30.

The protective layer 32 can be applied in one of three suitable forms of a water-soluble resist, a mold release agent, and a heat resistant grease. The three forms of the protective layer 32 will be described below, but the protective layer 32 is not limited to those three forms, as long as it allows easy removal of the light-transmissive member 8A that is disposed on the surface of the protective layer 32 (either by removing the light-transmissive member 8A from the protective layer 32 or by removing the light-transmissive layer 8A with the protective layer 32), an appropriate form of the protective layer 32 can be employed.

The water-soluble resist may have a water-soluble resin as a main component; that is, the water-soluble resist may be made singly of a water-soluble resin or may contain other materials as long as a water-soluble resin is contained. The protective layer 32 of a water-soluble resist can be removed by dissolving in water. A material for light-transmissive member which can be a resin that is softened at the time of disposing the light-transmissive member 8 may be heated to a temperature of about 100 to 200° C. in some cases to harden, so that the protective layer 32 which is a water-soluble resist can be removed by dissolving in water after heated to the temperature of about 100 to 200° C. Examples of the water-soluble resin include a polyvinylpyrrolidone-based resin. The viscosity before curing and the solubility in water can be adjusted by adjusting the mixing ratio of polyvinylpyrrolidone-based resins which have different molecular weights (such as a low-molecular weight polyvinylpyrrolidone-based resin and a high-molecular weight polyvinylpyrrolidone-based resin).

The protective layer 32 of a water-soluble resist can be disposed, for example, by using a method shown in FIG. 2B. That is, the light emitting devices 100A provided with the covering member 30 are immersed in a protective layer forming material in liquid form 36, that is, for example, in the present embodiment, a water-soluble resist or a water-soluble resist liquid with a predetermined viscosity. Next, after conducting drying when necessary, the water-soluble resist that adhered to the surface of the light emitting device 100A is hardened by way of, for example, ultraviolet ray irradiation. The method of attaching the water-soluble resist on the surface of the light emitting devices 100A is not limited to the immersing method illustrated above; other known methods such as a dispensing method, a printing method, a compression molding method or a spray-coating method can also be employed.

In the present specification, the term a "mold release agent" refers to a protective layer 32 that allows easy physical removal (in other words, mechanical removal) of the light-transmissive member 8A disposed thereon. In more detail, the light-transmissive member 8A disposed on the mold release agent can be removed with weaker force (i.e. force that is applied physically) than the force to remove the light-transmissive member 8A disposed on the light emitting elements 10. That is, the bonding force between the mold release agent and the light-transmissive member 8A is weaker than the bonding force between the upper surface of the light emitting element 10 and the light-transmissive member 8A. Accordingly, the light-transmissive member 8A disposed on the protective layer 32 can be removed without removing the light-transmissive member 8A disposed on the portion where the protective layer 32 is not provided. The light-transmissive member 8A can be physically removed by causing a fluid to collide against the light-transmissive member 8A, for example a liquid such as water or a gas such as air. In the present embodiment, the light-transmissive member 8A may be removed from the protective layer 32, or the light-transmissive member 8A may be removed with the protective layer 32. In another embodiment, a magnetic abrasive finishing method is employed to remove the light-transmissive member 8A with the protective layer 32. Magnetic abrasive finishing is typically used as a deburring method in which with the use of a magnetic material as a medium, minute burrs occurred in metal processing are removed and polishing and washing are performed. By using such a magnetic abrasive finishing, the burrs occurred on the cutting surfaces of the light emitting devices 100 at the time of dicing can be removed while also removing the mold release agent and/or the water-soluble resist. In order to facilitate formation of desired protective layer 32, and further in the case of necessity of removing the mold release agent, the mold release agent can be soluble in an alcohol or an alkaline solution to allow easy removal. The material for the light-transmissive member such as a resin that is softened at the time of disposing the light-transmissive member 8 may be heated to about 100 to 200° C. for hardening. Therefore, the light-transmissive member 8A disposed thereon can be physically removed relatively easily. A commercially available mold release agent can be used as a mold release agent, and for example, a fluorine-based mold release agent that contains fluorine as its main component with a mass ratio of 50% or greater, can be employed.

The heat resistant grease typically contains a silicone oil, a metal soap that is added to the silicone oil, and a filler. The heat resistant grease may contain an oilness-improving agent and/or an antioxidant as needed. A silicone oil that is one of the main component of the heat resistant grease easily dissolve in an organic solvent such as toluene, xylene, hexane, or an industrial gasoline. Also, an silicone oil has an excellent heat resistant property, so that the heat resistant grease has unhardening property (i.e. does not completely hardened). The heat resistant grease may not be completely hardened even at a hardening temperature of the fluorescent layer. Due to the two properties described above, the protective layer 32 made of the heat resistant grease has an advantage that it can be removed by using an organic solvent in a short period of time. In addition, the heat resistant grease has high thixotropic property. Accordingly, the heat resistant grease can be applied easily and partially (i.e. to a predetermined portion), so that the use amount in a line coating operation can be reduced.

The protective layer 32 of a water-soluble resist can be disposed, for example, by using a method shown in FIG. 2B. That is, the light emitting devices 100A provided with the covering member 30 are immersed in the protective layer forming material in liquid form 36; that is in the present embodiment, for example, a mold release agent dissolved in an alcohol or an alkaline solution, or a mold release agent dispersed in a liquid phase dispersion medium. Next, drying or the like is performed to form the protective layer 32 made of the mold release agent. The method of forming a layer of a mold release agent on the surface of the light emitting device 100A is not limited to the immersion method described above, and another known method such as a dispensing method, a printing method, a compression molding method, or a spray coating method may be employed. The protective layer 32 of a heat resistant grease can be formed, for example, by applying a line coating using an air-dispenser.

Next, as shown in FIG. 2D, the covering member 30 is removed. In the case where the covering member 30 has a sheet shape (or a tape-shape), the sheet-shaped covering member 30 can be easily removed by peeling. Then, as shown in FIG. 3D, the light-transmissive member 8A is formed as described below. The light emitting device 100C is obtained by disposing a light-transmissive member 8A on the light emitting device 100B after the covering member 30 is removed. In order to ensure the formation of the light-transmissive member 8 on the predetermined locations that were covered with the covering member 30, the light-transmissive member 8A is disposed also on locations other than the predetermined locations where the light-transmissive member 8 to be disposed, that is, the light-transmissive member 8A is disposed also on portions of the protective layer 32. In an embodiment shown in FIG. 3B, the upper surface and the whole side surfaces of the light emitting device 100C are covered with the light-transmissive member 8A.

Formation of the light-transmissive member 8A is performed by supplying the material of the light-transmissive member on the upper surface side of the base member 20 (that is, the upper surface side of the light emitting element 10) so that the light-transmissive member 8A is surely formed on the upper surface of the light emitting element. In the specification, the term "material of the light-transmissive member" refers to a material that can reach the surface of the light emitting device 100C to form the light-transmissive member 8A. In the case where the light-transmissive member 8A (also the light-transmissive member 8) contain a fluorescent material, the material of the light-transmissive member may be a mixture of a softened resin or a binder resin with such a fluorescent material described above. Moreover, the fluorescent material in this case may be a quantum dot fluorescent material as described above.

The method of supplying a material of the light-transmissive member from the upper surface side of the base member 20, a known method such as a spray coating method or a potting method may be employed. With a spray coating method, a sequential stacking of thin fluorescent material layers can be obtained, which allows adjustment of color tone as needed. Thus, occurrence of uneven color tone can be reduced in achieving light of a white color by the light emitting device 100. The material of the light-transmissive member supplied as described above is heated under appropriate conditions, for example, at a temperature in a range of 100 to 200° C., for 4 hours, to harden the resin component in the material of the light-transmissive member to form the light-transmissive member 8A.

Next, except for the portion of the light-transmissive member 8A that is formed on the portion where the protective layer 32 does not exist (that is, except for the portion to be the light transmissive member 8), the light-transmissive member 8A on the protective layer 32 is removed. Thus, the light emitting devices 100 shown in FIG. 3B can be obtained. The light-transmissive member 8A on the protective layer 32 can be entirely removed, but at least portions of the light-transmissive member 8A which will be in contact with the bonding members for external connection 56a, 56b at the time of bonding the light emitting device 100 to the mounting substrate are removed. As for the protective layer 32, the protective layer 32 may either be removed or not removed, provided that the protective layer 32 does not adversely affect the mountability of the light emitting device 100. Examples of such a case include, without separately conducting a removing operation, removal of the protective layer 32 occurs by evaporation due to the heat generated in a solder bonding (that is, a solder material is used for the material for external connection 56a, 56b) at the time of mounting the light emitting device 100 on the mounting substrate 50. On the other hand, in the case where an adverse effect of the protective layer 32 on the mountability of the light emitting device 100 is expected, the protective layer 32 will be removed.

Any known method can be used to remove the light-transmissive member 8A on the protective layer 32, as long as a portion of the light-transmissive member 8A that is to be the light-transmissive member 8. In other words, a portion of the light-transmissive member 8A disposed on a portion where the protective layer does not exist, is not removed. The removal of the light-transmissive member 8A can be performed either before or after singulation of a plurality of light emitting devices 100C which are connected to each other. However, removal of the light-transmissive member 8A can be performed at the same time of singulation as described below. In the case of removing the protective layer 32, any known method can be used as long as a portion of the light-transmissive member 8A that is to be the light-transmissive member 8. In other words, a portion of the light-transmissive member 8A disposed on a portion where the protective layer does not exist, is not removed. In the case of removing the protective layer 32, removing of the light-transmissive member 8A on the protective layer 32 and removing of the protective layer 32 can be performed either separately or in a same operation.

In the case where a water-soluble resist is used as the protective layer 32, performing the singulation by dicing allows for simultaneous achievement of singulation and removal of the light-transmissive member 8A disposed on the protective layer 32. In dicing, cutting is performed by using a cutting jig such as a rotary blade, and is generally performed while applying water (to the cutting point) to reduce temperature at the cutting portion and to remove the cutting scraps generated in the cutting. Incidentally, as described above, the water-soluble resist is easily dissolved in water. Accordingly, while the dicing performed under a usual condition, the water-soluble resist is dissolved and thus the light-transmissive member 8A disposed thereon can be removed. In the dicing as described above, singulation and removal of the light-transmissive member 8A can be achieved in the same operation and further, removal of the protective layer 32 can also be achieved in the same operation.

In the case of using a mold release agent for the protective layer 32, performing the singulation by dicing and in which adjusting the conditions of supplying water such as the water pressure applied to the light emitting device 100C, simultaneously to singulation, removing of the light-transmissive member 8A disposed on the protective layer 32 can be achieved without removing the light-transmissive member 8A disposed on the portions where the protective layer 32 does not exist. The mold release agent is generally water insoluble, and the protective layer 32 made of such a mold release agent may likely remain on the surface of the light emitting devices 100 after dicing. In such a case, as described above in view of mountability or the like, the mold release agent may be removed from the obtained light emitting devices 100. The mold release agent can be removed by using a known method that includes an alcohol washing or an alkaline solution washing. According to the method of producing as described above, the singulated light emitting devices 100 can be obtained.

The light emitting device 100 described above includes one light emitting element 10. But the light emitting device according to each embodiment of the present disclosure is not limited thereto, and a light emitting device that includes a plurality of light emitting element 10 can also be included in the technical scope of the present invention. In the below, a variational example with a light emitting device that includes a plurality of light emitting elements 10 will be illustrated. FIG. 5 is a schematic cross-sectional view of a light emitting device 200 according to an embodiment in which a plurality of light emitting elements 10 are employed. In the below, components different from those in the light emitting device 100 will be mainly described. Unless specifically indicated, the configuration may be similar to that in the light emitting device 100.

The light emitting device 200 includes a plurality of light emitting elements 10. In the embodiment shown in FIG. 5, two light emitting elements 10 are included. In the light emitting device 200, one light-transmissive member 8 covers the upper surfaces of the plurality of light emitting elements 10, but a plurality of light-transmissive members 8 may be arranged so that one light-transmissive member 8 covers the upper surface of one light emitting element or the upper surfaces of two or more light emitting elements 10 in the case of three or more light emitting elements 10 are employed.

The plurality of light emitting elements 10 can be electrically connected to the connection terminals 4a, 4b in any appropriate forms as long as each of the connection terminals 4a, 4b has an exposed portion that allows for the electrical connection. In the embodiment shown in FIG. 5, electrical connection is established by using two connection terminals 4a and one connection terminal 4b. In more detail, the two light emitting elements 10 are arranged with their electrode 14a and the electrode 14b placed oppositely, as shown in the cross-sectional view of FIG. 5, in the arrangement of the two light emitting elements 10, the electrodes 14b are at the inner side and the electrodes 14a are at the outer side. Then, one connection terminal 4b is electrically connected to the electrode 14b of each of the two light emitting elements 10. The connection terminal 4b includes, in addition to the part arranged extended on the upper surface of the insulating member 2, a via 42b that penetrates the insulating member 2 and the extended portion 44b on the lower surface. The extended portion 44b on the lower surface serves as the exposed portion. Accordingly, at the time of mounting the light emitting device 200 on the mounting substrate 50, the bonding member 56b is in contact with the extended portion 44b on the lower surface. The connection terminals 4a and/or 4b in the light emitting device 100 may also include a via 42b in addition to or alternatively to the portion that extended on a corresponding side surface of the insulating member 2. Meanwhile, the two connection terminals 4a are respectively electrically connected to the electrodes 14a of different light emitting elements 10.

The light emitting device 200 can be produced by using a method similar to that is used to produce the light emitting device 100 described above.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a base member including a first connection terminal, a second connection terminal and a third connection terminal which are disposed on an upper surface thereof, each of the first connection terminal and the second connection terminal having an exposed portion exposed to outside;
    a first light emitting element disposed on the upper surface of the base member and flip-chip mounted on the first connection terminal and the third connection terminal;
    a second light emitting element disposed on the upper surface of the base member and flip-chip mounted on the second connection terminal and the third connection terminal;
    a light-shielding member covering at least a portion of one side surface of each of the first light emitting element and the second light emitting element;

a first light-transmissive member covering an upper surface of the first light emitting element; and a second light-transmissive member covering an upper surface of the second light emitting element, wherein the shielding member fills a space between the first light emitting element and the second light emitting element, and wherein the first light-transmissive member and the second light-transmissive member are separated from each other through the space as viewed from a light emitting surface side of the first light emitting element member.

2. The light emitting device according to claim 1, wherein the third connection terminal is connected to an electrode of the first light emitting element and an electrode of the second light emitting element, the electrode of the first light emitting element and the electrode of the second light emitting element having same polarity.

3. The light emitting device according to claim 1, wherein each of the first light emitting element and the second light emitting element includes a first electrode and a second electrode, wherein the first connection terminal is electrically connected to the first electrode of the first light emitting element, wherein the second connection terminal is electrically connected to the first electrode of the second light emitting element, and wherein the third connection terminal is electrically connected to the second electrode of the first light emitting element and the second electrode of the second light emitting element.

4. The light emitting device according to claim 1, wherein the third connection terminal includes a terminal portion disposed on the upper surface of the base member, a via portion disposed inside of the base member and an extended portion disposed on a lower surface of the base member.

5. The light emitting device according to claim 1, wherein the light-shielding member covers a part of each of the first connection terminal, the second connection terminal and the third connection terminal.

6. The light emitting device according to claim 1, wherein the light-shielding member fills a space between the first light emitting element and the base member, and a space between the second light emitting element member and the base member.

7. The light emitting device according to claim 1, wherein each of the first light-transmissive member and the second light-transmissive member comprises a green fluorescent material and a red fluorescent material.

8. The light emitting device according to claim 7, wherein the green fluorescent material is a β-sialon-based fluorescent material and the red fluorescent material is a KSF-based fluorescent material.

9. The light emitting device according to claim 1, being a light emitting device for a backlight of a display.

10. The light emitting device according to claim 1, being a side-view type light emitting device.

11. The light emitting device according to claim 1, being a top-view type light emitting device.

12. The light emitting device according to claim 1, wherein at least one of the first light-transmissive member and the second light-transmissive member comprises a stacked-layer member made of a plurality of fluorescent material layers.

13. The light emitting device according to claim 12, wherein a median particle diameter of the fluorescent material of at least one of the plurality of fluorescent material layers is 30 μm or less.

14. The light emitting device according to claim 1, wherein each of the first light-transmissive member and the second light-transmissive member is made of a silicone resin.

\* \* \* \* \*